United States Patent
Katano et al.

(10) Patent No.: US 9,929,232 B2
(45) Date of Patent: Mar. 27, 2018

(54) SEMICONDUCTOR DEVICE COMPRISES TWO OR MORE REGIONS THAT HAVE A SAME IMPURITY CONCENTRATION AND DIFFERING CARRIER CONCENTRATIONS

(71) Applicant: FUJI ELECTRIC CO., LTD., Kawasaki-shi, Kanagawa (JP)

(72) Inventors: Tomonori Katano, Matsumoto (JP); Fumikazu Imai, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/414,700

(22) Filed: Jan. 25, 2017

(65) Prior Publication Data

US 2017/0271439 A1    Sep. 21, 2017

(30) Foreign Application Priority Data

Mar. 16, 2016    (JP) .................................. 2016-053127

(51) Int. Cl.

| H01L 29/00 | (2006.01) |
| H01L 29/06 | (2006.01) |
| H01L 29/16 | (2006.01) |
| H01L 29/20 | (2006.01) |
| H01L 21/265 | (2006.01) |

(Continued)

(52) U.S. Cl.
CPC ........ *H01L 29/0615* (2013.01); *H01L 21/046* (2013.01); *H01L 21/0415* (2013.01); *H01L 21/26513* (2013.01); *H01L 21/26546* (2013.01); *H01L 21/324* (2013.01); *H01L 21/67115* (2013.01); *H01L 29/0688* (2013.01); *H01L 29/16* (2013.01); *H01L 29/1602* (2013.01); *H01L 29/167* (2013.01); *H01L 29/1608* (2013.01); *H01L 29/2003* (2013.01); *H01L 29/36* (2013.01); *H01L 29/861* (2013.01); *H01L 29/6603* (2013.01); *H01L 29/6606* (2013.01); *H01L 29/66045* (2013.01); *H01L 29/66068* (2013.01); *H01L 29/66143* (2013.01); *H01L 29/66212* (2013.01); *H01L 29/66325* (2013.01); *H01L 29/66477* (2013.01);

(Continued)

(58) Field of Classification Search
CPC ..... H01L 29/861; H01L 29/36; H01L 29/167; H01L 29/872

See application file for complete search history.

(56) References Cited

U.S. PATENT DOCUMENTS 5,914,500 A    6/1999 Bakowski et al.
9,728,599 B1 *  8/2017 Matsunaga ......... H01L 29/0623
(Continued)

FOREIGN PATENT DOCUMENTS

JP    2001-508950 A    7/2001

*Primary Examiner* — Ngan Ngo
(74) *Attorney, Agent, or Firm* — Rabin & Berdo, P.C.

(57) ABSTRACT

An impurity of a second conductivity type is selectively doped in a surface of a semiconductor substrate of a first conductivity type to form doped regions. A portion of a surface of the doped regions is covered by a heat insulating film. At least a remaining portion of the surface of the doped regions is covered by an absorbing film and the doped regions are heated through the absorbing film, enabling an impurity region of the second conductivity type to be formed having two or more of the doped regions that have a same impurity concentration and differing carrier concentrations.

4 Claims, 3 Drawing Sheets

(51) Int. Cl.
*H01L 21/04* (2006.01)
*H01L 21/324* (2006.01)
*H01L 21/67* (2006.01)
*H01L 29/167* (2006.01)
*H01L 29/861* (2006.01)
*H01L 29/36* (2006.01)
H01L 29/872 (2006.01)
H01L 29/78 (2006.01)
H01L 29/739 (2006.01)
H01L 29/66 (2006.01)

(52) U.S. Cl.
CPC .... *H01L 29/66522* (2013.01); *H01L 29/7393* (2013.01); *H01L 29/7801* (2013.01); *H01L 29/872* (2013.01)

(56) References Cited

U.S. PATENT DOCUMENTS

| | | | |
|---|---|---|---|
| 2002/0100935 A1* | 8/2002 | Inoue | H01L 29/0619 257/341 |
| 2009/0008651 A1* | 1/2009 | Okuno | H01L 29/6606 257/77 |
| 2017/0263703 A1* | 9/2017 | Okumura | H01L 29/0661 |

\* cited by examiner

SEMICONDUCTOR DEVICE COMPRISES TWO OR MORE REGIONS THAT HAVE A SAME IMPURITY CONCENTRATION AND DIFFERING CARRIER CONCENTRATIONS

CROSS REFERENCE TO RELATED APPLICATIONS

This application is based upon and claims the benefit of priority of the prior Japanese Patent Application No. 2016-053127, filed on Mar. 16, 2016, the entire contents of which are incorporated herein by reference.

BACKGROUND OF THE INVENTION

1. Field of the Invention

Embodiments of the present invention relate to a semiconductor device that uses silicon or a semiconductor material having a wide bandgap, and a method of manufacturing a semiconductor device.

2. Description of the Related Art

In semiconductor devices such as power devices, an edge termination structure called a junction termination extension (JTE) and that reduces the level of charge stepwise in an outer peripheral direction from a $p^+$ region of an outer periphery of an active region in order to establish an element breakdown voltage level is often employed (for example, refer to Published Japanese-Translation of PCT Application, Publication No. 2001-508950).

Further, a second-conductivity-type region is selectively formed in a front surface or rear surface of a semiconductor substrate of a first conductivity type and by changing the impurity concentration of this second-conductivity-type region, a semiconductor device is formed. In a JTE region, the carrier concentration is reduced stepwise on the semiconductor substrate to control the level of charge.

FIG. 4 is a cross-sectional view of a traditional JTE structure. A Schottky barrier diode will be described as an example. For example, on an $n^+$ semiconductor substrate 1 that is a material such as silicon carbide (SiC), an $n^-$ region 2 that is a drift layer is formed by epitaxial growth. On the $n^-$ region 2, for example, an active portion $p^+$ region 3 implanted with, for example, aluminum (Al) is formed and for example, a Schottky metal 5 such as titanium (Ti) is provided thereon.

In an outer periphery of the $p^+$ region 3, a p region 41 having a low carrier concentration is formed and in a periphery farther outward, a $p^-$ region 42 having an even lower concentration is formed. With such a configuration, when voltage of a reverse direction is applied, electric field concentration occurring in the edge termination structure is relaxed, enabling a required breakdown voltage level to be established.

FIG. 5 is a cross-sectional view of a traditional space-modulated JTE structure. The ratio of the $p^-$ region 42 to the p region 41 varies stepwise with distribution whereby the extent of electric field concentration may be further relaxed and the breakdown voltage level may be further improved. Such an edge termination structure is a technology used not only in Schottky barrier diodes but also in MOS power devices such as metal oxide semiconductor field effect transistors (MOSFET), insulated gate bipolar transistors (IGBT), and the like.

SUMMARY OF THE INVENTION

According to one aspect of the present invention, semiconductor device includes an impurity region of a second conductivity type, selectively provided in a surface of a semiconductor substrate of a first conductivity type. The impurity region of the second conductivity type has two or more regions that have a same impurity concentration and differing carrier concentrations.

In the semiconductor device, the two or more regions have an impurity activation rate that differs according to region.

The semiconductor device includes an active region and an edge region surrounding the active region, as semiconductor device structure. The two or more regions are provided as an edge termination structure of the edge region.

In the semiconductor device, the semiconductor substrate is formed of one of silicon carbide, gallium nitride, silicon, and diamond.

According to another aspect of the present invention, a method of manufacturing a semiconductor device in which an impurity region of a second conductivity type is selectively formed in a surface of a semiconductor substrate of a first conductivity type, includes selectively doping an impurity of the second conductivity type in the surface of the semiconductor substrate and forming a doped region; covering a portion of a surface of the doped region with a heat insulating film; covering at least a remaining portion of the surface of the doped region with an absorbing film; and heat treating the doped region through the absorbing film.

In the method of manufacturing a semiconductor device, a film that absorbs 10% or more of energy of light is used as the absorbing film.

In the method of manufacturing a semiconductor device, carbon is used as the absorbing film.

In the method of manufacturing a semiconductor device, the heat treating is performed by optical heating.

In the method of manufacturing a semiconductor device, the heat treating uses, as a light source, one of a halogen lamp, an excimer lamp, a YAG laser, an excimer laser, a $CO_2$ laser, and a semiconductor laser.

In the method of manufacturing a semiconductor device, a material having a heat conduction rate of 50 W/m·K or less is used as the heat insulating film.

In the method of manufacturing a semiconductor device, a material containing silicon nitride or silicon oxide is used as the heat insulating film.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
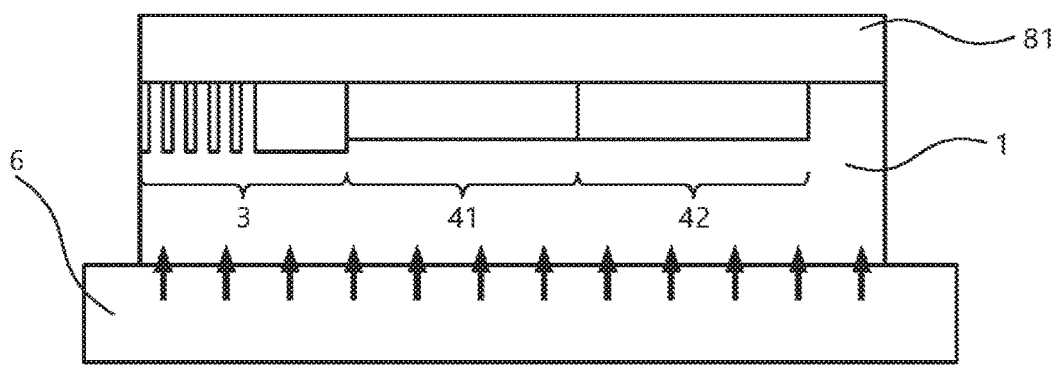
FIG. 1 is a cross-sectional view for describing heat treatment at a time of formation of a typical JTE structure.

Embodiments of the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

First, a method of forming a JTE structure in a typical Schottky barrier diode will be described.

Figure 4:
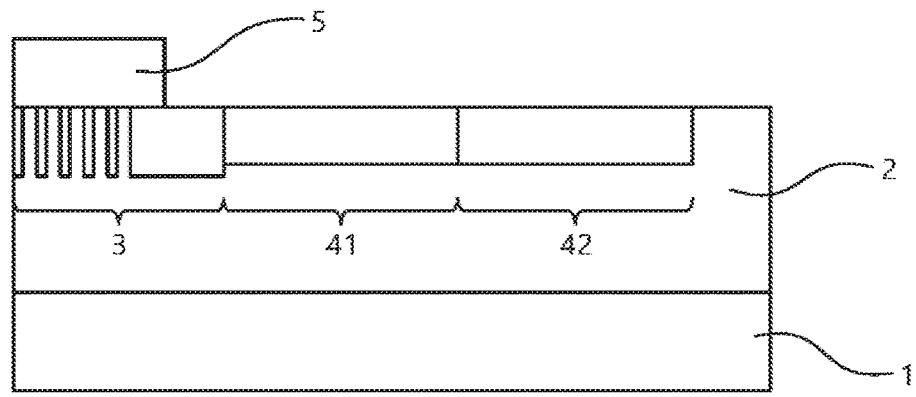
FIG. 4 is a cross-sectional view of a traditional JTE structure.
Figure 5:
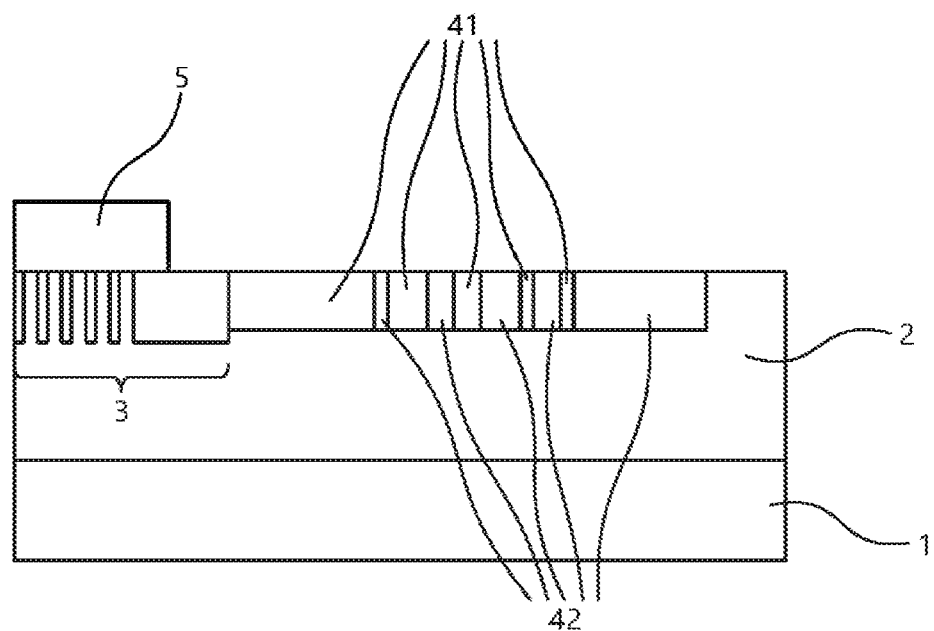
FIG. 5 is a cross-sectional view of a traditional space-modulated JTE structure.

In a typical Schottky barrier diode (refer to FIG. 4), when the semiconductor substrate 1 is formed of a material such as SiC, an impurity such as implanted Al, etc. does not become a carrier as it is and the impurity first becomes a carrier by being taken into the material structure of the semiconductor substrate 1 consequent to heat treatment at 1000 degrees C. or higher. This process is called activation.

FIG. 1 is a cross-sectional view for describing the heat treatment at the time of formation of a typical JTE structure. As depicted in FIG. 1, in the $p^+$ region 3 of the active portion, and in the p region 41 and the $p^-$ region 42 of the JTE, an impurity of respectively differing concentrations is implanted. Thereafter, a substrate stage 6 is heated by high-frequency induction heating, etc., and the semiconductor substrate 1 is heated by radiation or heat conduction from the substrate stage 6 whereby the $p^+$ region 3 of the active portion and the p region 41 and $p^-$ region 42 of the JTE are activated.

Here, a substrate surface (main surface) of the semiconductor substrate 1 is covered by a cap film 81 in advance so as to not become rough from heat treatment and the cap film 81 is removed after the heat treatment.

Figure 2:
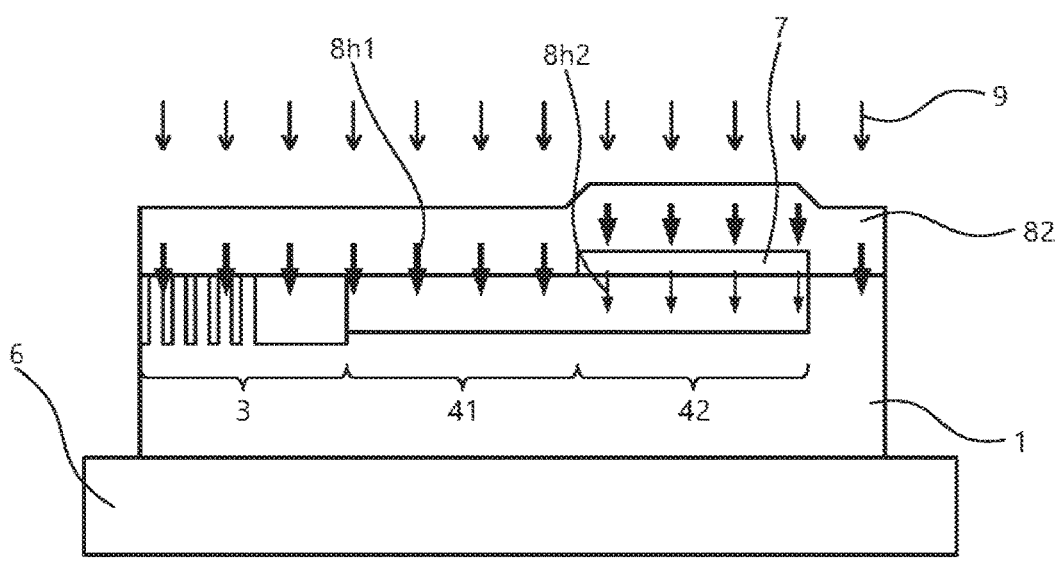
FIG. 2 is a cross-sectional view depicting a state during formation of a JTE structure according to a first embodiment of the present invention.

FIG. 2 is a cross-sectional view depicting a state during formation of a JTE structure according to a first embodiment of the present invention. In the first embodiment, as depicted in FIG. 2, an impurity of Al, etc. is implanted in the p regions 41, 42 (although described hereinafter, the region 42 becomes a $p^-$ region) of the JTE and, in the $p^+$ region 3 of the active portion to be formed selectively on the semiconductor substrate 1 made from a material of a first conductor. At this time, the regions 41 and 42 have a common impurity concentration. The semiconductor substrate 1 uses one of silicon carbide, gallium nitride, silicon, and diamond.

Thereafter, on a portion of the p region 42 on the semiconductor substrate 1, a heat insulating film 7 having a low heat conduction rate and a heat insulating property, in particular, a heat insulating film formed of, for example, silicon nitride, silicon oxide, etc. having a heat conduction rate of 50 W/m·K or less, is formed.

Next, an absorbing film 82 of, for example, carbon, etc. and absorbing light energy and generating heat is formed so as to cover the region 3, the region 41, and the region 42 (a portion formed by the $p^+$ region 3, the p region 41, and the p region 42 formed of a material of a second conductor). Here, when heat conduction from a substrate stage is used as later-stage heating, a function of absorbing light energy need not be required of the absorbing film 82 and a material having good heat conduction suffices.

The absorbing film 82 is heated and the implanted impurity is activated by a heat flux from the absorbing film 82. In particular, the absorbing film 82, for example, is irradiated with heating light 9 using a light source such as a halogen lamp, an excimer lamp, etc., or a laser light source such as YAG, an excimer, $CO_2$, a semiconductor, etc. The absorbing film 82 absorbs the energy of the heating light 9 and generates heat. Here, a method of generating heat may be any method provided the absorbing film 82 is heated and, for example, radiation or heat conduction from the substrate stage may be used. Here, when heating is by heat conduction, to ensure uniformity in the surface, the substrate stage and the absorbing film 82 have to be uniformly adhered. In contrast, when heating light radiation, etc. is used, an advantage is that irrespective of surface formation of the substrate, uniformity may be ensured.

When heating light is used, a thickness and an absorption coefficient of the material of the absorbing film 82 are set so that the absorbing film 82 provides a sufficient heating temperature to the region 3, the region 41, and the region 42 by the light energy of the heating light 9 (so that at least 10% or more of the light energy of the heating light 9 may be absorbed by the portion including the region 3, the region 41, the region 42).

The region 3 and the region 41 are heated by a heat flux $8h1$ from the absorbing film 82 and the region 3 and the region 41 are activated similar to a traditional case whereby respective $p^+$ and p regions (the $p^+$ region 3 and the p region 41) are formed.

On the other hand, in the region 42, since a heat flux $8h2$ smaller than the heat flux $8h1$ is provided by the heat insulating film 7, the heating temperature is lower than in the region 41. The rate at which the implanted impurity is activated to carriers is dependent on the heating temperature and at a low heating temperature, the activation rate is low whereby the region 42 (the $p^-$ region 42) has a lower carrier concentration than the region 41.

Accordingly, by optimizing the material, thickness, irradiation conditions of the heating light, etc. of the heat insulating film 7, a carrier concentration corresponding to the $p^-$ region 42 of the JTE structure may be imparted. The heat insulating film 7 may preferably have a film heat conduction rate of 50 W/m·K or less, and silicon nitride, silicon oxide, etc. may be applied. For example, on top of setting the thickness of the heat insulating film 7 to be about 0.3 μm, it suffices to irradiate the heating light under a condition that the region 41 reaches about 1700 degrees C.

When an impurity concentration of the regions 41 and 42 is set to be $2.5 \times 10^{13}$ cm$^{-2}$, and an activation rate of the region 42 is set to be 20% against an activation rate of 40% for the region 41, the carrier concentration is $1.0 \times 10^{13}$ cm$^{-2}$ in the region 41, and is $0.5 \times 10^{13}$ cm$^{-2}$ in the region 42.

Figure 3:
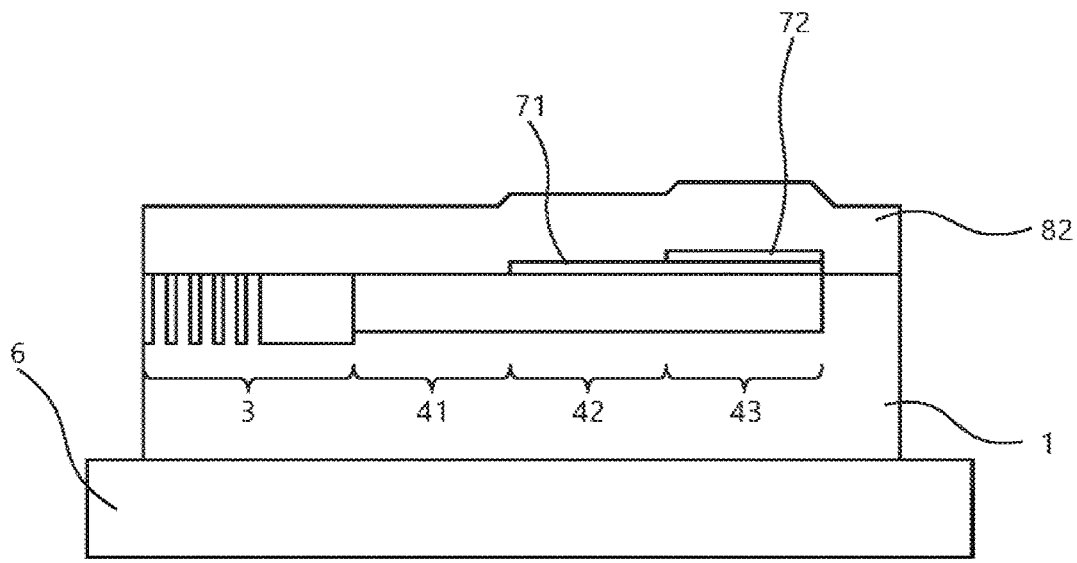
FIG. 3 is a cross-sectional view depicting a state during formation of a JTE structure according to a second embodiment of the present invention.

FIG. 3 is a cross-sectional view depicting a state during formation of a JTE structure according to a second embodiment of the present invention. In the second embodiment, an example of a JTE structure in which compared to the first embodiment, the extent of electric field concentration is further relaxed and the breakdown voltage level is raised will be described.

As depicted in FIG. 3, the second embodiment is an example of a JTE configured by the 3 regions of the p region 41, the $p^-$ region 42, and a $p^{--}$ region 43.

In the second embodiment, on the semiconductor substrate 1, the heat insulating film 71 and a heat insulating film 72 are combined and formed, and the heat insulating film thickness of the heat insulating film 71 of a region 42 portion and the heat insulating film thickness of the heat insulating film 72 of a region 43 portion are changed. In the configuration example in FIG. 3, on the regions 42 and 43, the heat insulating film 71 is formed, and on the heat insulating film 71 in the region 43 portion, the heat insulating film 72 is further formed.

The thicknesses of the heat insulating films 71 and 72 of the regions 42 and 43, for example, are 0.3 μm and 0.5 μm, respectively. As a result, in the region 43, consequent to a higher insulating effect, a heating temperature that is one step lower results whereby a carrier concentration corresponding to the $p^{--}$ region is obtained.

In each of the described embodiments, an example through a heat insulating film between an absorbing film and an impurity region has been described. Without limitation to formation of such a heat insulating film, for each region (for example, regions 41, 42, 43), direct variance of the irradiation period and the intensity of the heating light irradiated on the absorbing film 82 may obtain the same working effect.

For example, when laser light is swept in the absorbing film 82 surface by a laser light source to perform heating, by changing the sweeping speed, sweeping frequency according to region, the heating temperature of each region may be controlled.

As described, according to the embodiments of the present invention, the number of processes of impurity implantation for forming a JTE region may be reduced, enabling a problem of increased product cost that traditionally occurs to be solved.

In the description above, although formation of an edge termination structure of a Schottky barrier diode has been described, without limitation hereto, application is similarly possible in a case of a vertical MOS-type structure having an active region that is a MOSFET, IGBT, etc. and with respect to a rear structure MOSFET, IGBT, etc.

In addition, application is possible in a structure in which a vertical MOSFET and a vertical Schottky barrier diode are integrated together on a single chip and the carrier concentration on a rear surface side of the semiconductor substrate is to be partially changed. Moreover, application is possible in the formation of a rear side region of a RC-IGBT in which an IGBT and a diode are integrated together.

In the embodiments above, although a case of a SiC semiconductor substrate has been described as an example, without limitation hereto, realization is possible with a semiconductor substrate of silicon, GaN, etc.

In configuring the traditional JTE structure above, implantation of an impurity has to be repeated for each region of a different carrier concentration. Moreover, to obtain an optimal concentration distribution in a depth direction in materials in which thermal diffusion of an impurity is difficult such as SiC, even within one region, the energy has to be changed while repeatedly performing implantation work many times.

Therefore, the number of man-hours required in the implantation increases or overload of the impurity implantation apparatus occurs whereby problems of reduced operating ratio of the manufactured device overall and increased product cost occur.

However, according to the invention described above, to form regions of differing carrier concentrations on the semiconductor substrate without having to repeatedly perform impurity implantation of differing concentrations for each region, impurity implantation is performed by a common concentration whereby regions of differing carrier concentrations may be formed by making the heating temperature for activating each region different to control the activation rate. As a result, impurity implantation which has a large man-hour burden may be reduced, enabling simple manufacturing without increasing the product cost.

According to the present invention, an effect is achieved in that regions of differing carrier concentrations may be easily formed on a semiconductor substrate.

As described, the present invention is suitable for semiconductor elements that use silicon, a wide bandgap, etc. as a semiconductor material and, for example, is useful in inverters, switching power sources, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising
   a semiconductor substrate of a first conductivity type; and
   an impurity region of a second conductivity type selectively provided in a surface of the semiconductor substrate of the first conductivity type,
   wherein the impurity region of the second conductivity type has two or more regions that have a same impurity concentration and differing carrier concentrations.

2. The semiconductor device according to claim 1, wherein the two or more regions have an impurity activation rate that differs according to region.

3. The semiconductor device according to claim 1, further comprising:
   an active region and an edge region surrounding the active region, as a semiconductor device structure,
   wherein the two or more regions are provided as an edge termination structure of the edge region.

4. The semiconductor device according to claim 1,
   wherein the semiconductor substrate is formed of one of silicon carbide, gallium nitride, silicon, and diamond.

* * * * *